US008233318B2

(12) United States Patent
Ramani et al.

(10) Patent No.: US 8,233,318 B2
(45) Date of Patent: *Jul. 31, 2012

(54) PHASE CHANGE MEMORY

(75) Inventors: Pradeep Ramani, Boise, ID (US); John D. Porter, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 159 days.

This patent is subject to a terminal disclaimer.

(21) Appl. No.: 12/763,750

(22) Filed: Apr. 20, 2010

(65) Prior Publication Data

US 2010/0202195 A1    Aug. 12, 2010

Related U.S. Application Data

(63) Continuation of application No. 12/056,045, filed on Mar. 26, 2008, now Pat. No. 7,729,163.

(51) Int. Cl.
*G11C 11/00* (2006.01)

(52) U.S. Cl. ........................ 365/163; 365/148

(58) Field of Classification Search ............... 365/163, 365/148

See application file for complete search history.

(56) References Cited

U.S. PATENT DOCUMENTS

| | | | |
|---|---|---|---|
| 6,487,113 B1 * | 11/2002 | Park et al. | ..................... 365/163 |
| 6,570,784 B2 | 5/2003 | Lowrey | |
| 6,625,054 B2 * | 9/2003 | Lowrey et al. | ................ 365/148 |
| 6,873,538 B2 | 3/2005 | Hush | |
| 6,928,022 B2 | 8/2005 | Cho et al. | |
| 6,930,909 B2 | 8/2005 | Moore et al. | |
| 6,954,385 B2 | 10/2005 | Casper et al. | |
| 7,149,103 B2 * | 12/2006 | Ahn | .............................. 365/148 |
| 7,274,586 B2 | 9/2007 | Choi et al. | |
| 7,436,693 B2 | 10/2008 | Kang et al. | |
| 2003/0002331 A1 | 1/2003 | Park et al. | |
| 2003/0067013 A1 | 4/2003 | Ichihara et al. | |
| 2003/0123277 A1 | 7/2003 | Lowrey et al. | |
| 2005/0117388 A1 | 6/2005 | Cho et al. | |
| 2006/0221679 A1 | 10/2006 | Kang et al. | |
| 2007/0133267 A1 | 6/2007 | Cho et al. | |
| 2007/0189065 A1 | 8/2007 | Suh et al. | |

FOREIGN PATENT DOCUMENTS

KR    10-2005-0046041 A    5/2005
WO              0030101 A1    5/2000

OTHER PUBLICATIONS

European Search Report, mailed Feb. 25, 2011 (8 pages).
International Search Report and Written Opinion for related PCT Application PCT/US2009/001653, dated Nov. 4, 2009 (12 pgs.).
Bedeschi, F, et al. "SET and RESET Pulse Characterization in BJT-Selected Phase-Change Memories," IEEE, International Symposium on Circuits and Systems, pp. 1270-1273. (May 2005).

(Continued)

*Primary Examiner* — Anh Phung
(74) *Attorney, Agent, or Firm* — Brooks, Cameron & Huebsch, PLLC

(57) ABSTRACT

The present disclosure includes devices and methods for operating resistance variable memory cells. One or more embodiments include applying a programming signal to a resistance variable material of a memory cell, and decreasing a magnitude of a trailing portion of the applied programming signal successively according to a number of particular decrements. The magnitude and the duration of the number of particular decrements correspond to particular programmed values.

23 Claims, 8 Drawing Sheets

OTHER PUBLICATIONS

Lee, Kwang-Jin, et al. "A 90nm 1.8V 512MB Diode-Switch PRAM with 266MB/s Read Throughput," ISSCC 2007, Session 26, Non-Volatile Memories, pp. 472-474. (2007).

Lee, Myoung-Jae, et al. "2-stack 1D-1 R Cross-point Structure with Oxide Diodes as a Switch Elements for High Density Resistance RAM applications," IEEE, pp. 771-774. (2007).

Lee, S.H., et al. "Full Integration and Cell Characteristics for 64Mb Nonvolatile PRAM," IEEE, Symposium on VLSI Technology, Digest of Technical Papers, pp. 20-21. (2004).

Suh, D.-S, et al. "Critical Quenching Speed Determining Phase of Ge2Sb2Te5 in Phase-Change Memory," IEDM, pp. 1-4. (2006).

* cited by examiner

PHASE CHANGE MEMORY

This application is a Continuation of U.S. application Ser. No. 12/056,045, filed Mar. 26, 2008, now U.S. Pat. No. 7,729,163, issued on Jun. 16, 2010, the specification of which is incorporated herein by reference.

TECHNICAL FIELD

The present disclosure relates generally to semiconductor memory devices and, more particularly, to phase change memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among other types of memory.

Resistance variable memory devices, such as PCRAM devices, can include a structural phase change material such as a chalcogenide alloy, for instance, which can be programmed into different resistivity states to store data. The phase change memory cells are nonvolatile and the particular data stored in a phase change memory cell can be read by sensing the cell's resistance.

The chalcogenide alloy can exhibit a reversible structural phase change from amorphous to crystalline. A small volume of the chalcogenide alloy can be integrated into a circuit that allows the cell to act as a fast switching programmable resistor. This programmable resistor can exhibit greater than 40 times dynamic range of resistivity between the crystalline state (low resistivity) and the amorphous state (high resistivity), and is also capable of exhibiting multiple, intermediate states that allow multi-bit storage in each cell. That is, resistance variable memories may achieve multi-level cell (MLC) functionality via programming of memory cells to one of a number of different resistance levels.

In order to accurately read the programmed state of a phase change memory cell, it is beneficial to provide non-overlapping resistance distributions between the different program states. Programming a phase change memory cell such that the resistance of the cell is within the desired distribution can be challenging. For instance, fabrication processes and material variations among phase change memory cells can cause cells to reach a particular amorphous state or a particular crystalline state at different applied current/voltage levels. That is, the phase change material of different memory cells may undergo state transitions at different temperatures, which can result in widened resistance distributions among programmed cells and can lead to data read errors.

DETAILED DESCRIPTION

Methods, devices, and systems for operating phase change memory cells are described herein. Embodiments of the present disclosure can provide a programmable write signal shaped to improve resistance distributions associated with phase change memory cells. One or more embodiments include applying a programming signal to a phase change material of a memory cell, and decreasing a magnitude of a trailing portion of the applied programming signal successively according to a number of particular decrements. The magnitude and the duration of the number of particular decrements correspond to particular programmed values.

In one or more embodiments, the programming signal is a current pulse applied to the phase change material from a driver circuit, and the current magnitude output by the driver circuit changes in response to changes to a digital value received by the driver circuit. In various embodiments, programming circuitry can include a waveform shaping component having an output bus coupled to the driver circuit, and a magnitude of the applied programming current pulse is determined by a value applied to the output bus. In one or more embodiments, the waveform shaping component is configured to modify a magnitude of a trailing portion of the programming current pulse by applying a number of particular values to the output bus to decrease the magnitude of the trailing portion according to a number of programmed values provided to the waveform shaping component.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
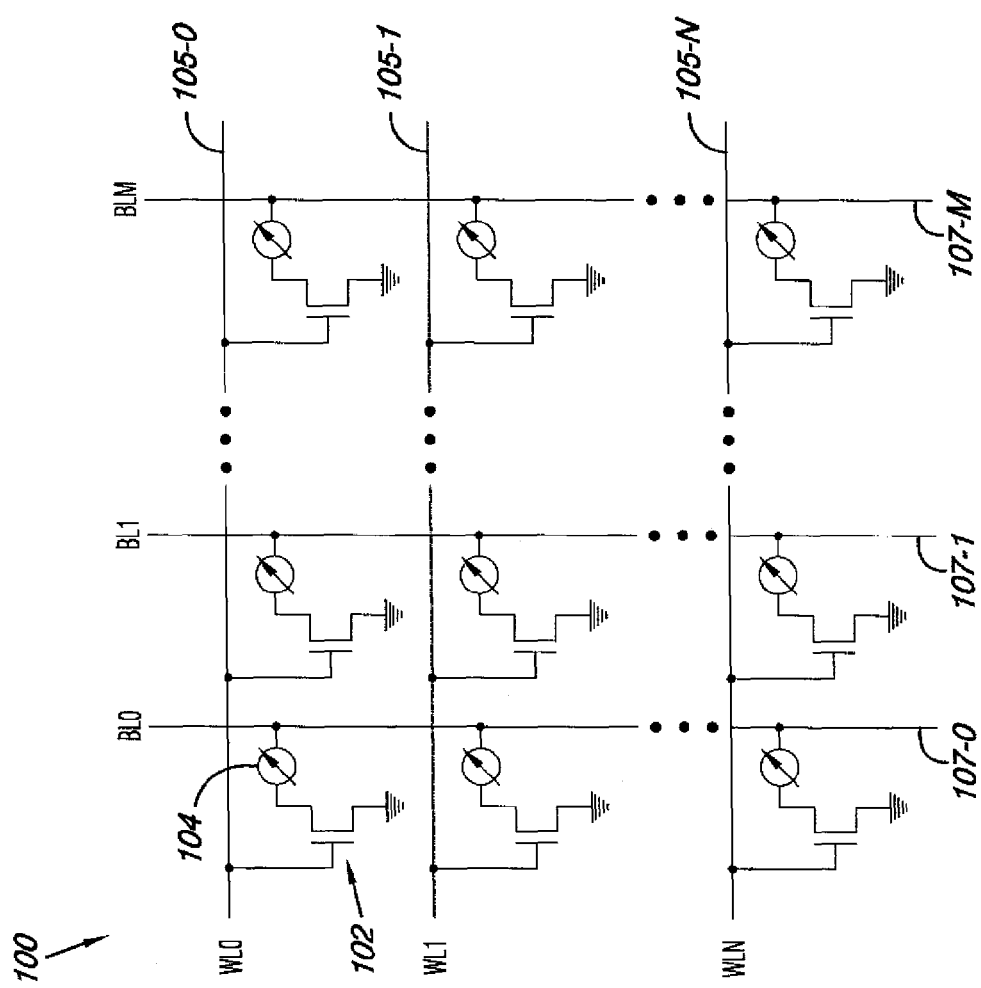
FIG. 1 is a schematic of a portion of a phase change memory array that can be used with one or more embodiments of the present disclosure.

FIG. 1 is a schematic of a portion of a phase change memory array 100 that can be used with one or more embodiments of the present disclosure. In the embodiment illustrated in FIG. 1, the memory array 100 includes a number of phase change memory cells each having an associated access device 102 and resistance variable element 104, e.g., a phase change material 104. The access devices 102 can be operated, e.g., turned on/off, to access the memory cells in order to perform operations such as data programming and/or data reading operations on the resistance variable elements 104.

In the embodiment illustrated in FIG. 1, the access devices 102 are metal oxide semiconductor field effect transistors (MOSFETs). As shown in FIG. 1, a gate of each MOSFET 102 associated with each memory cell is coupled to one of a number of select lines 105-0 (WL0), 105-1 (WL1), . . . , 105-N (WLN), i.e., each select line 105-0, 105-1, . . . , 105-N is coupled to a row of phase change memory cells. The select lines 105-0, 105-1, . . . , 105-N may be referred to herein as "word lines." The designator "N" is used to indicate that a memory array can include a number of select lines.

The resistance variable elements 104 can be a phase change chalcogenide alloy such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 1, each resistance variable element 104 is coupled to one of a number of sense lines 107-0 (BL0), 107-1 (BL1), . . . , 107-M (BLM), i.e., each sense line 107-0, 107-1, . . . , 107-M is coupled to a column of phase change memory cells. The sense lines 107-0, 107-1, . . . , 107-M may be referred to herein as "bit lines." The designator "M" is used to indicate that a memory array can include a number of sense lines. For ease of addressing in the digital environment, the number of select lines 105-1, . . . , 105-N and the number of sense lines 107-1, . . . , 107-M can each be some power of two, e.g., 256 select lines by 4,096 sense lines. However, embodiments are not limited to particular numbers of select lines and/or sense lines.

In operation, appropriate voltage and/or current signals, e.g., pulses, can be applied to the sense lines 107-0, 107-1, . . . , 107-M and select lines 105-0, 105-1, . . . , 105-N in order to program data to and/or read data from the phase change memory cells of the array 100. As an example, the data stored by a phase change memory cell of array 100 can be determined by turning on an access device, e.g., 102, and sensing a current passing through the phase change element, e.g., 104. The current sensed on the bit line associated with the memory cell being read, e.g., bit line 107-0, 107-1, . . . , 107-M, corresponds to a resistance level of the phase change element 104, which in turn corresponds to a particular data value, e.g., a binary value such as 1, 0, 001, 111, 1011, etc.

Embodiments of the present disclosure are not limited to the example array 100 illustrated in FIG. 1. For example, as one of ordinary skill in the art will appreciate, the access device 102 associated with a particular memory cell can be device other than a MOSFET. In some embodiments, the access device 102 can be a diode or a bipolar junction transistor (BJT), among other types of access devices. Also, a memory array can have an architecture other than that illustrated in FIG. 1, as will be understood by one of ordinary skill in the art.

As one of ordinary skill in the art will appreciate, the phase change memory array 100 can be coupled to programming circuitry and/or sensing circuitry (not shown in FIG. 1). Examples of programming circuitry and methods in accordance with embodiments of the present disclosure are described further below in connection with FIGS. 3-7.

Figure 2:
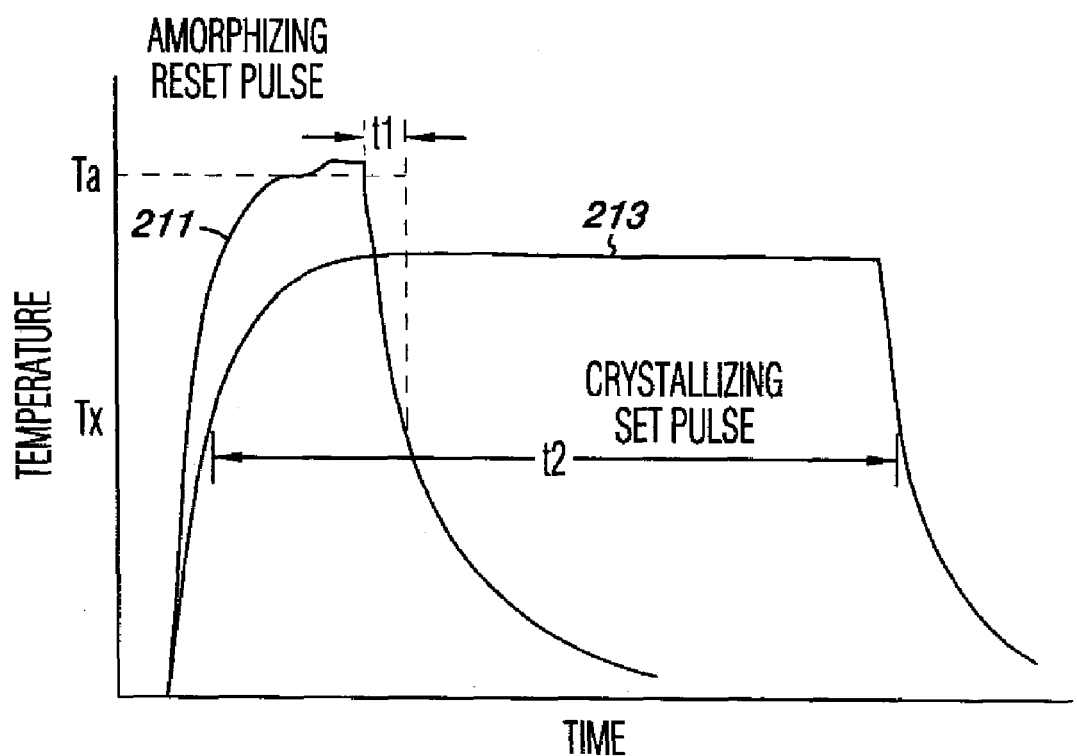
FIG. 2 illustrates a previous approach for programming phase change memory cells.

FIG. 2 illustrates a previous approach for programming phase change memory cells. In FIG. 2, the pulse 211 represents an amorphizing (reset) pulse, e.g., a pulse used to place one or more phase change memory cells in an amorphous (high resistivity) state. The pulse 213 represents a crystallizing (set) pulse, e.g., a pulse used to place one or more phase change memory cells in a crystalline (low resistivity) state. The reset pulse 211 and the set pulse 213 can be applied to a particular memory cell in order to alter the resistance of the phase change element, e.g., phase change element 104 shown in FIG. 1, by raising/lowering the temperature of the cell in a manner such that the resistance of the cell is changed, e.g., programmed, to a value that corresponds to a particular desired data state.

As illustrated in the previous approach shown in FIG. 2, the reset pulse 211 involves raising the temperature of a phase change material, e.g., a temperature of phase change element 104 illustrated in FIG. 1, to a temperature Ta sufficient to melt the phase change material and cooling the phase change material over a short time period, i.e., t1, to amorphize such that the phase change material does not re-foul' some portion of its internal crystalline structure. As such, the reset pulse 211 can place the phase change material in a relatively amorphous state corresponding to a relatively high resistance value, e.g., about 100 kiloohm to 1 megaohm, for instance.

As illustrated in the previous approach shown in FIG. 2, the set pulse 213 involves raising the temperature of a phase change material above a temperature Tx and maintaining the temperature of the phase change material for a time, e.g., t2, sufficient to allow crystallization of the phase change material to occur. As such, the set pulse 213 can place the phase change material in a relatively crystalline state corresponding to a relatively low resistance value, e.g., about 1 kiloohm to 10 kiloohm, for instance.

The shape of a programming signal, e.g., a programming reset pulse 211 and/or a programming set pulse 213, can influence the resistance distributions corresponding to desired data to be stored in phase change memory cells. Unlike the set pulse 213 shown in the previous approach illustrated in FIG. 2, embodiments of the present disclosure can include a waveform shaping component configured to modify a magnitude of a trailing portion of a set programming signal, e.g., a set current pulse, by applying a number of particular values to an output bus, e.g., a current control bus, to decrease the magnitude of the trailing portion according to a number of programmed values provided to the waveform shaping component.

In one or more embodiments of the present disclosure, each of a number of different particular current magnitudes is applied to the phase change material of one or more memory cells for a particular duration and the different particular current magnitudes are based on different digital values carried by the current control bus and provided to a driver circuit. In one or more embodiments of the present disclosure, a digital scheme is used to shape the trailing portion of a set programming current pulse in a stair step down ramp. As described further below, in various embodiments, the magnitude and/or duration of each step of the trailing portion can based on digital values provided to a pulse shaping circuit in accordance with embodiments of the present disclosure.

Figure 3A:
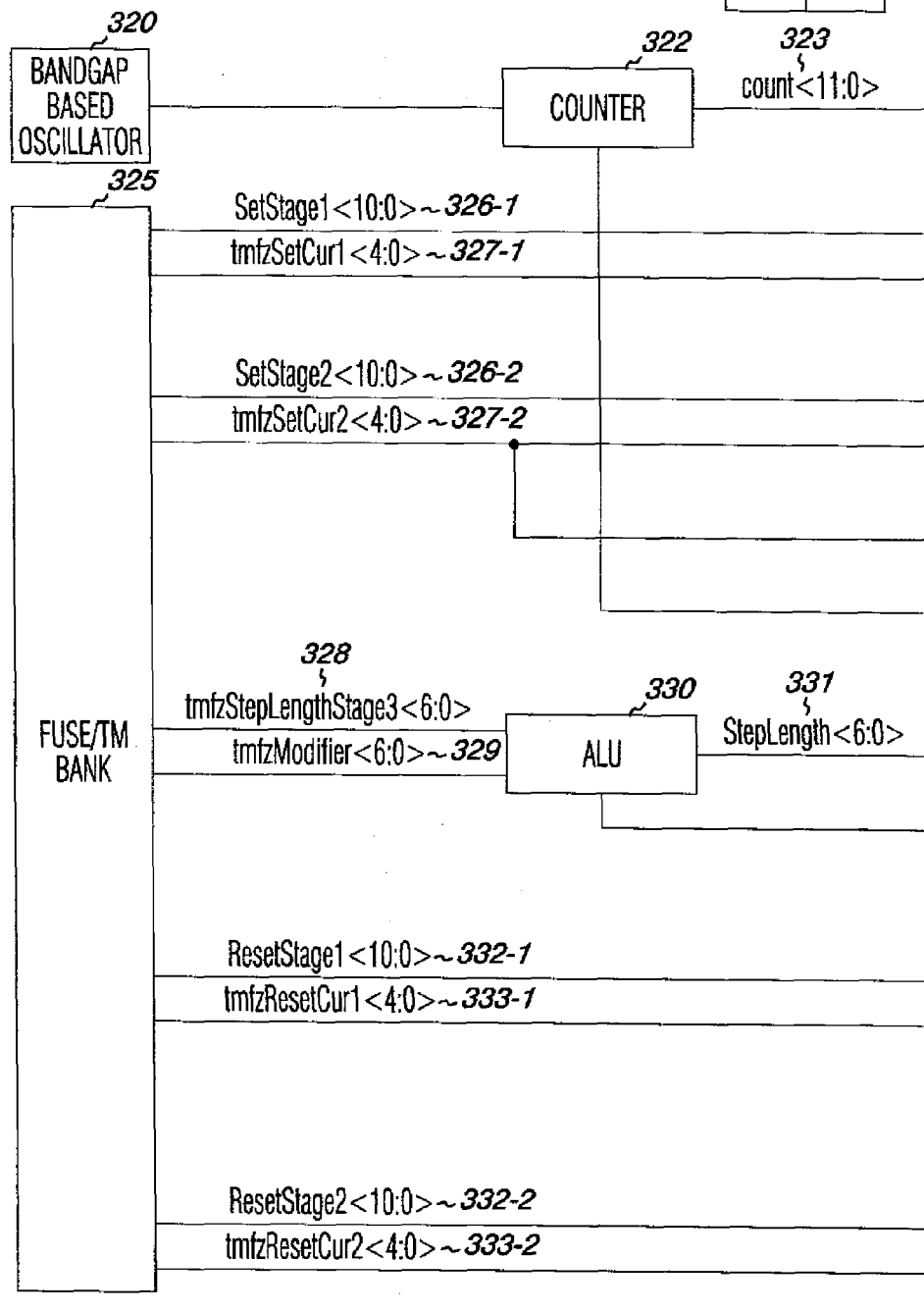
FIG. 3 (shown as 3A and 3B) illustrates an example of programming circuitry in accordance with an embodiment of the present disclosure.
Figure 3B:
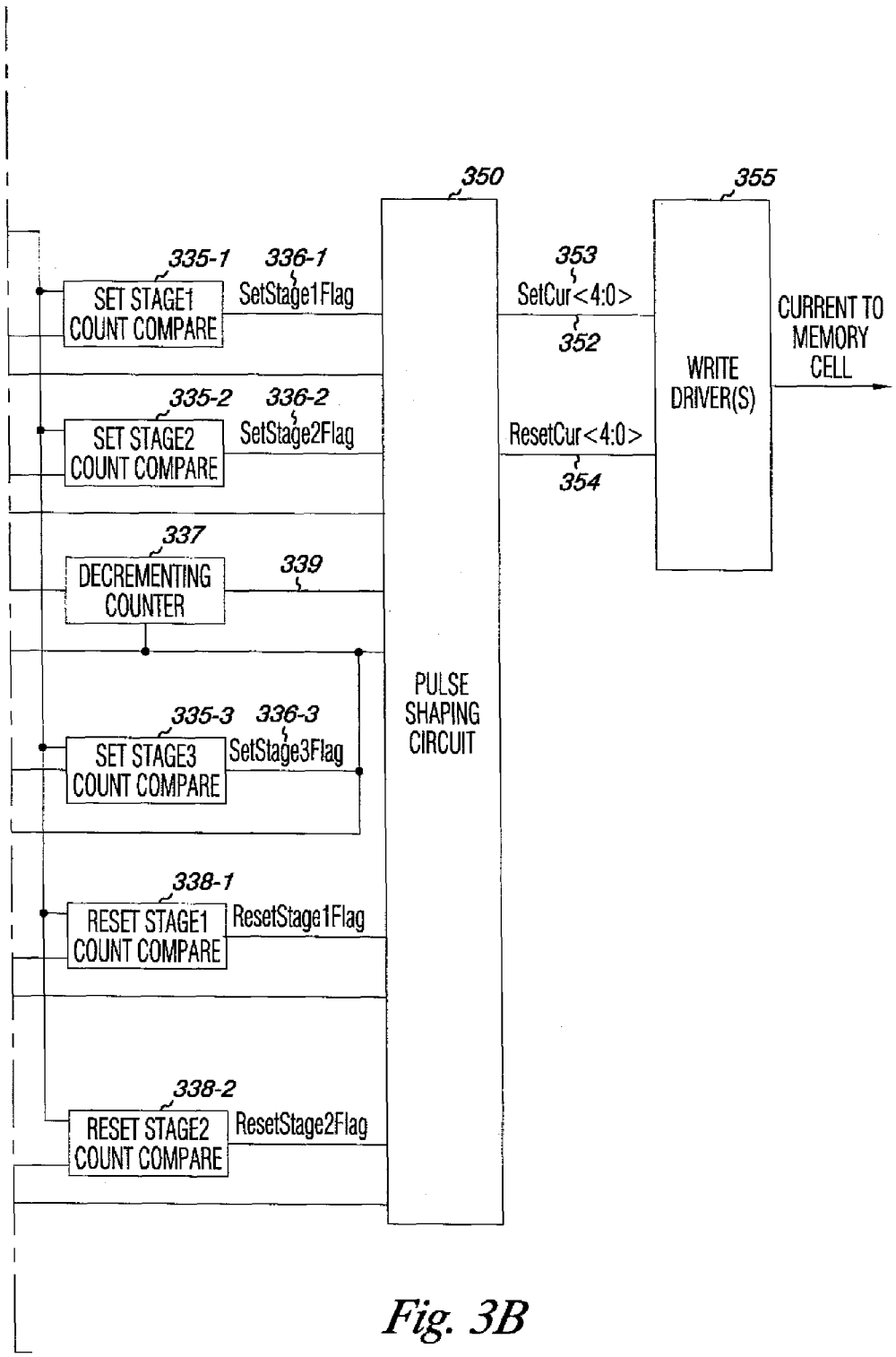
Figure 4:
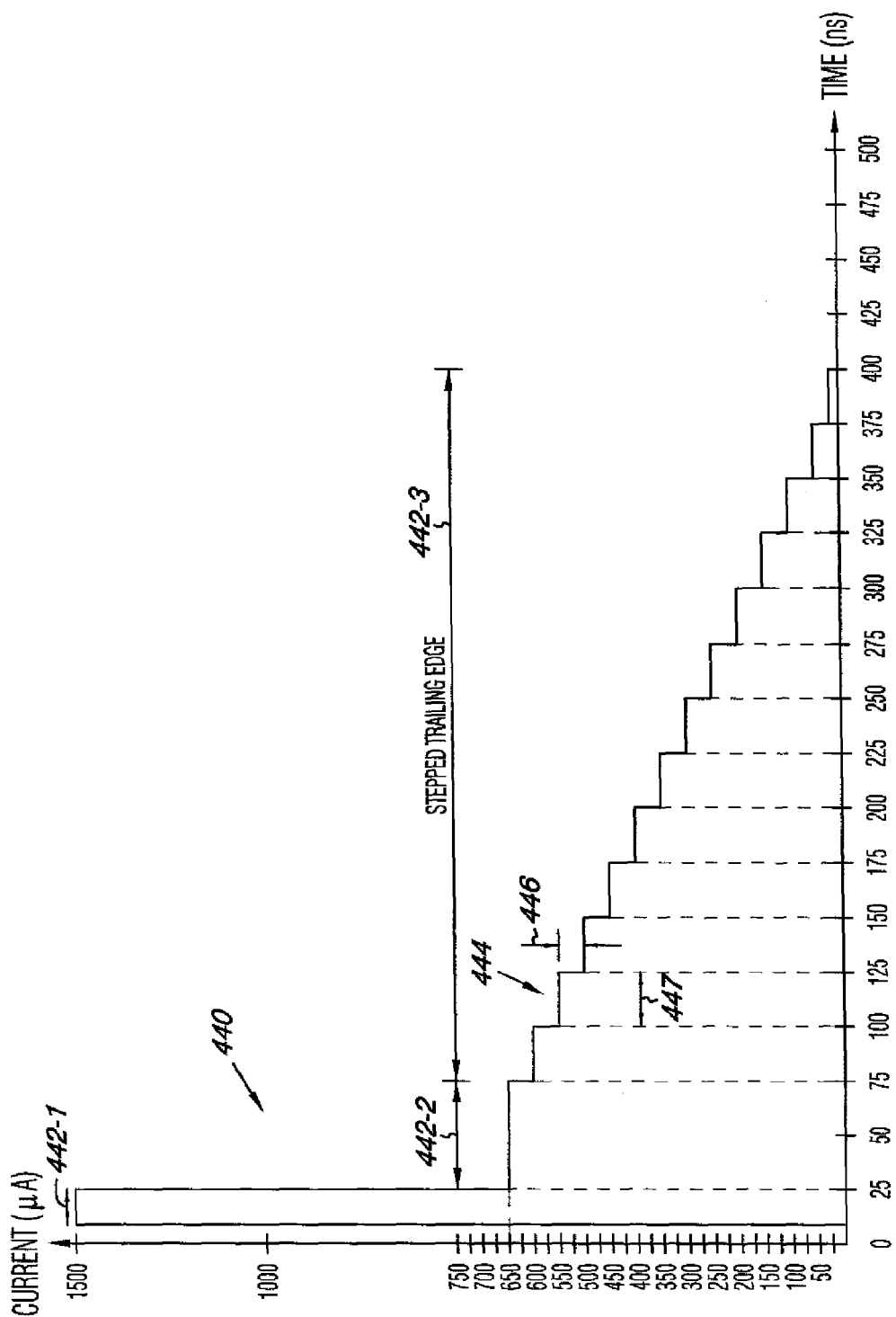
FIG. 4 illustrates an example of a programming signal in accordance with an embodiment of the present disclosure.
Figure 5A:
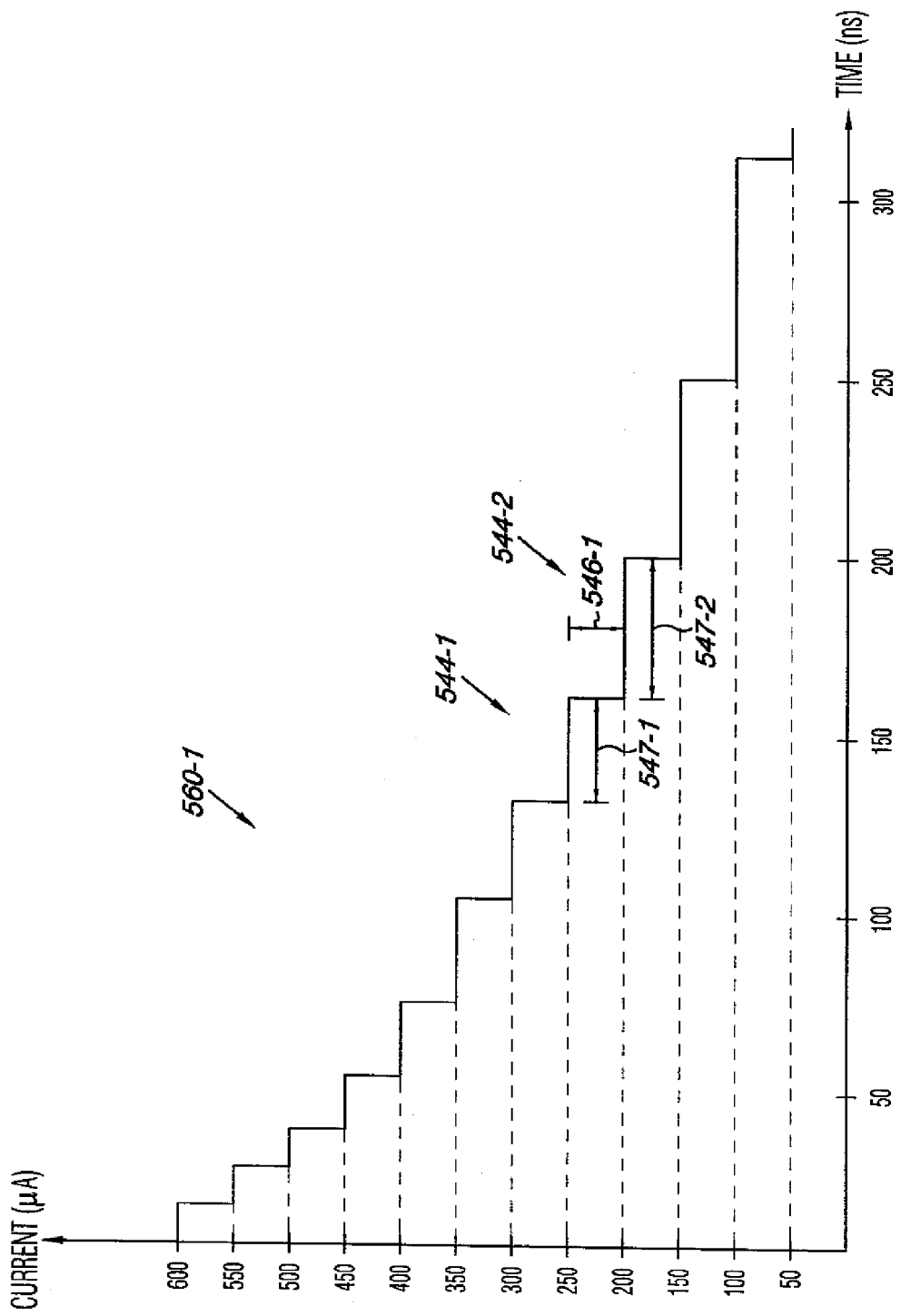
FIG. 5A illustrates a portion of a programming signal according to an embodiment of the present disclosure.
Figure 5B:
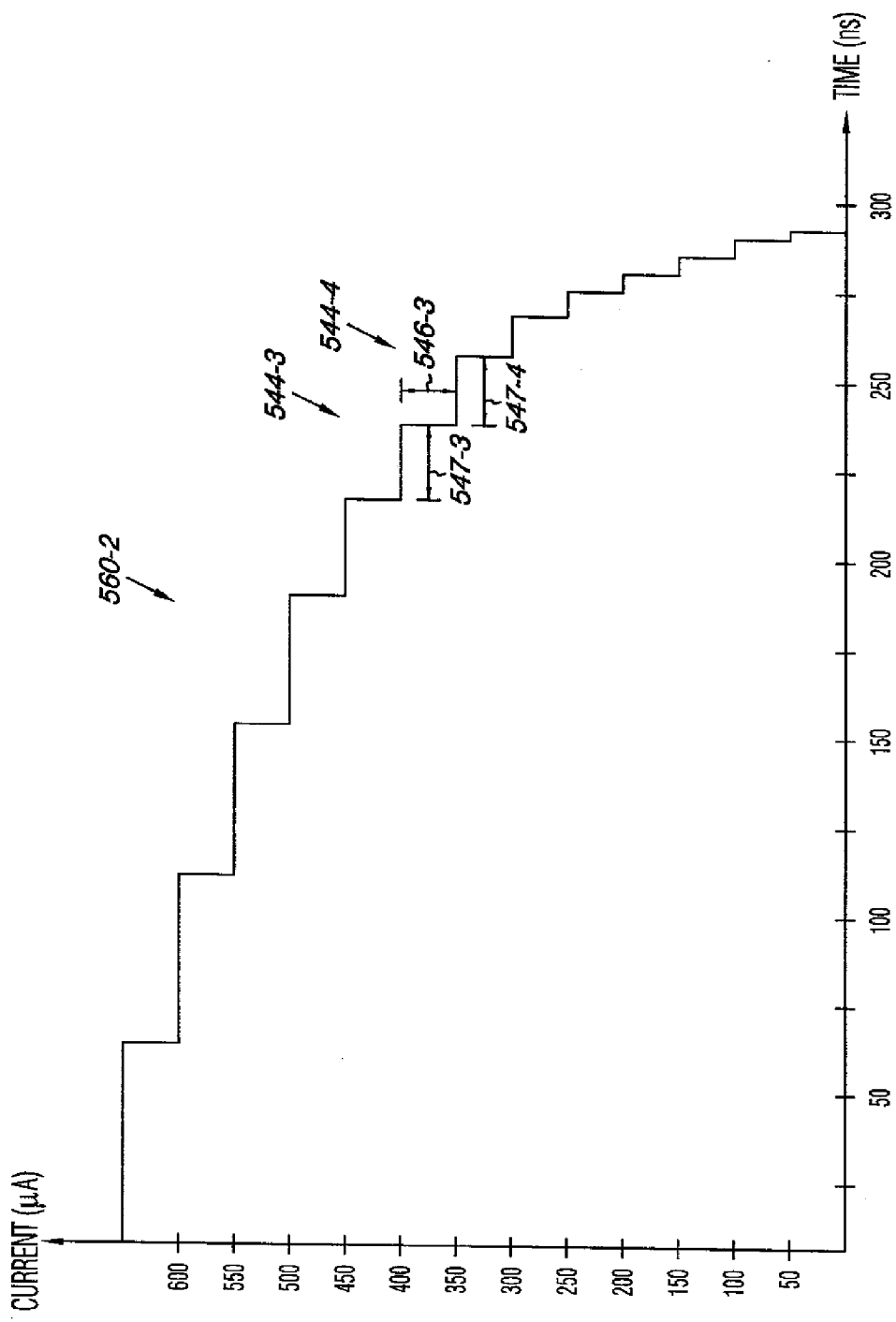
FIG. 5B illustrates a portion of a programming signal according to an embodiment of the present disclosure.

FIG. 3 illustrates an example of programming circuitry in accordance with an embodiment of the present disclosure. As illustrated, FIG. 3 is separated into FIGS. 3A and 3B for ease of illustration. The programming circuitry illustrated in the embodiment of FIG. 3 can be coupled to an array of phase change memory cells, e.g., array 100 described in connection with FIG. 1. The programming circuitry can be used to provide programming pulses, e.g., current pulses, to one or more phase change memory cells of a memory array in order to program the cell to a particular data state by adjusting the resistance of the resistance variable element of the particular memory cell or cells. As an example, the programming signals output by the write driver 355 can be applied to one or more bit lines, e.g., bit lines 107-0, 107-1, . . . , 107-M, of a phase change memory array in order to program selected memory cells to particular resistance levels, e.g., particular data states. Examples of programming current waveforms that can be provided by the programming circuitry illustrated in FIG. 3 are shown in FIGS. 4, 5A, and 5B.

The programming current pulses provided by the programming circuitry illustrated in the embodiment of FIG. 3 can be shaped in accordance with one or more embodiments described herein. For instance, in one or more embodiments, and as described further in connection with FIGS. 4, 5A, and 5B, a trailing portion of a programming set current signal, e.g., set pulse 213 shown in FIG. 2, can be successively decreased according to a number of particular decrements, e.g., in a stepped down manner. In such embodiments, the magnitude and/or duration of each step of the trailing edge of the set current signal can correspond to particular programmed values, e.g., programmable digital values.

For instance, in one or more embodiments, and as illustrated in FIG. 3, the programming circuitry can include one or more driver circuits, e.g., write driver 355, that output a particular programming signal, e.g., a programming set current pulse or a reset current pulse, a magnitude of which depends on a digital value carried by a bus, e.g., set current control bus 352 or reset current control bus 354.

As described further below, each digital value that can be carried by a bus corresponds to a particular current magnitude output by the write driver 355, such that the shape of a programming set current pulse or a reset programming current pulse output by the driver 355 can be digitally adjusted by changing the digital value carried by the appropriate bus. For instance, in the embodiment illustrated in FIG. 3, the digital value 353 (SetCur<4:0>) carried by the set current control bus 352 can be changed to adjust the shape of the programming set current pulse output by driver 355, e.g., to digitally control the set current magnitude output by the write driver 355 to achieve a desired programming set current signal shape. The digital value ResetCur<4:0> carried by the reset current control bus 354 can also be changed to achieve a desired reset current signal shape.

In various embodiments, the particular digital values carried by the current control buses, e.g., 352 and 354, can be generated by a waveform shaping component, e.g., pulse shaping circuit 350. The particular values generated by the pulse shaping circuit 350 and applied to a particular bus, e.g., 352 or 354, can be adjusted in response to input signals provided to the pulse shaping circuit 350 in order to achieve the desired shape of the programming set and reset current signals, respectively.

Although in the embodiment illustrated in FIG. 3, the digital values carried by the set current control bus 352 and the reset current control bus 354 are five bit values, embodiments are not so limited. For example, the number of bits associated with bus 352 and/or digital value 353 can be greater or less than five bits, depending on a desired granularity of the programming set current pulse to be output from driver 355. That is, a five bit value such as value 353 can represent 32 ($2^5$) different binary values corresponding to 32 different current magnitudes that can be output by the write driver 355. However, in various embodiments, the digital value 353 can be more or less than five bits such that greater or fewer than 32 different current magnitudes can be output by driver 355.

In various embodiments, and as described further below and in connection with FIGS. 4, 5A, and 5B, a programming set current signal can be shaped in multiple stages. In such embodiments, the current magnitude and duration of each stage can be based on programmable digital values. In some such embodiments, a first stage can be used to charge a bit line corresponding to a cell being programmed, a second stage can be used to melt a phase change memory material of the cell being programmed, and a third stage can be used to create a relatively narrow resistance distribution associated with a data state to which the cell is being programmed. In one or more embodiments, the resistance distribution can be narrowed by gradually decreasing the magnitude of the set current signal a number of times, e.g., based on digital values provided to a write driver, over a particular time interval associated with the third stage.

In one or more embodiments, the pulse shaping circuit 350 generates the appropriate digital values on buses 352 or 354 in response to received input signals from a number of circuit components. For example, in the embodiment illustrated in FIG. 3, the programming circuitry includes an oscillator 320, an incrementing counter 322, a fuse programmable component 325, an arithmetic logic unit (ALU) 330, a decrementing counter 337, and a number of count compare components 335-1, 335-2, 335-3, 338-1, and 338-2 that operate to provide input signals to the pulse shaping circuit 350. The provided input signals can indicate the particular digital value to be generated by the pulse shaping circuit 350 and applied to the appropriate bus, e.g., bus 352 for a set operation or bus 354 for a reset operation. The input signals provided to the pulse shaping circuit 350 can also indicate when the pulse shaping circuit 350 is to change the digital value, e.g., 353. As such, the pulse shaping circuit 350 receives input signals that determine the magnitude of the current output by the write driver 355 as well as the duration that a particular current magnitude is output by the writer driver 355.

In the embodiment illustrated in FIG. 3, the oscillator 320 is a bandgap based oscillator 320 that provides clock pulses to an input of the incrementing counter 322. The count 323 of counter 322 is received by the number of count compare components 335-1, 335-2, 335-3, 338-1, and 338-2. Each of the count compare components 335-1, 335-2, 335-3, 338-1, and 338-2 compares the received count value 323 to a programmed value corresponding to a particular time duration and outputs a control flag to the pulse shaping circuit 350 based on the comparison.

In one or more embodiments, the fuse programmable component, e.g., 325, can be used to set a number of programmed values. In the embodiment illustrated in FIG. 3, the fuse programmable component is a programmable fuse array 325 (FUSE/TM BANK) having a number of associated programmable values 326-1, 327-1, 326-2, 327-2, 328, 329, 332-1, 333-1, 332-2, and 333-2. The particular values to which the programmable values 326-1, 327-1, 326-2, 327-2, 328, 329, 332-1, 333-1, 332-2, and 333-2 are programmed is based on a desired shape of a set or reset programming signal.

In the embodiment illustrated in FIG. 3, the programmable value 326-1 (SetStage1<10:0>) is provided to count compare circuit 335-1 and the programmable value 327-1 (tmfzSetCur1<4:0>) is provided to the pulse shaping circuit 350. The value of the programmable value 327-1 corresponds to the particular value 353 to be generated by pulse shaping circuit 350 and applied to set current control bus 352. As such, the value of the programmable value 327-1 indicates a particular current magnitude to be output by write driver 355. In one or more embodiments, the programmed value 327-1 can indicate a current of about 1.5 mA, for example. The value of the programmable value 326-1 indicates a particular time duration that the particular current magnitude indicated by the value of programmable value 327-1 is to be output by write driver 355. That is, the programmed value 326-1 indicates how long the programmed value 327-1 is to be carried by current control bus 352 during a set programming operation. In one or more embodiments, the programmed value 326-1 can indicate a duration of about 15 ns, for example.

The programmable value 326-2 (SetStage2<10:0>) is provided to count compare circuit 335-2 and the programmable value 327-2 (tmfzSetCur2<4:0>) is provided to the pulse shaping circuit 350. The value of the programmable value 327-2 corresponds to the particular value 353 to be generated by pulse shaping circuit 350 and applied to set current control bus 352. As such, the value of the programmable value 327-2 indicates a particular current magnitude to be output by write driver 355. En one or more embodiments, the programmed value 327-2 can indicate a current of about 650 µA, for example. The value of the programmable value 326-2 indicates a particular time duration that the particular current magnitude indicated by the value of programmable value 327-2 is to be output by write driver 355. That is, the programmed value 326-2 indicates how long the programmed value 327-2 is to be carried by current control bus 352 during a set programming operation. In one or more embodiments, the programmed value 326-2 can indicate a duration of about 50 ns, for example.

In the embodiment illustrated in FIG. 3, the programmable values 328 (tmfzStepLengthStage3<6:0>) and 329 (tmfzModifier<6:0>) are provided to ALU 330. The programmable value 328 can indicate a time duration associated with a number of successive steps of a decreasing trailing portion of a set programming signal as described herein and illustrated in FIGS. 4, 5A, and 5B. In various embodiments, the time duration indicated by programmable value 328 can be between about 5 ns to 125 ns. The programmed value 329 can be used to adjust the time duration indicated by the programmed value 328. That is, the ALU 330 can output a modified time duration associated with the number of successive steps by performing an operation such as addition, subtraction, multiplication, and/or division on the programmed values 328 and 329. In the embodiment illustrated in FIG. 3, the modified time duration value 331 (StepLength<6:0>) is provided to the count compare circuit 335-3.

In operation, e.g., during a set programming operation, the control flag 336-1 (SetStage1Flag) can indicate when the programmed digital value 327-1 is to be applied to the control bus 352 based on comparison of the programmed value 326-1 and the count value 323 by count compare circuit 335-1. Similarly, the control flag 336-2 (SetStage2Flag) can indicate when the programmed digital value 327-2 is to be applied to the control bus 352 based on comparison of the programmed value 326-2 and the count value 323 by count compare circuit 335-2.

As illustrated in FIG. 3, the programmed value 327-2 is provided to an input of the decrementing counter 337, whose output signal 339 is provided to the pulse shaping component 350. The control flag 336-3 (SetStage3Flag) indicates, based on a comparison by count compare circuit 335-3 of the count 323 and the value 331, the point at which the programmed value 327-2 is to be successively decreased according to a number of decrements via decrementing counter 337.

As such, the digital value 353 carried by control bus 352 is decremented from the programmed value 327-2 to a number of different values each corresponding to a different current magnitude, e.g., each subsequent decremented value corresponding to a lesser current magnitude to be output by the write driver 355. The decremented digital values are received by the pulse shaping circuit 350 via output 339 and the pulse shaping circuit 350 generates the decremented digital values on the control bus 352, i.e., the pulse shaping circuit changes the digital value 353 to the digital value indicated by the output signal 339 of the decrementing counter 337.

As described above, each particular decremented digital value corresponds to a particular current magnitude. The duration that each decremented digital value is generated by the pulse shaping circuit 350, e.g., the step duration, depends on the programmed values 328 and 329. As such, the programming circuitry shown in the embodiment illustrated in FIG. 3 can be use to provide a trailing portion of a programming pulse that has a desired shape. In one or more embodiments, the trailing portion of the programming signal can be gradually ramped downward in a stepped manner. The magnitude and/or duration of the number of steps can be adjusted to produce various trailing portion shapes. For example, as described below in connection with FIGS. 4, 5A and 5B, the trailing portion can have a linear or nonlinear shape.

The digital nature of the programming circuitry associated with embodiments of the present disclosure can provide various benefits. For instance, the fuse programmability of the digital values can allow the values to be easily modified in response to particular desired programming current waveforms. As an example, the trailing portion of a set current waveform can be programmed to be stepped down in a linear manner or can be programmed to be stepped down in a nonlinear manner with minor adjustments, e.g., modifying the programmable step duration. Unlike analog schemes, the digital implementation associated with embodiments of the present disclosure is easily portable in response to changes in technology, e.g., scaling improvements. Furthermore, digital schemes in accordance with embodiments of the present disclosure can provide improved noise immunity as compared to analog programming circuitry implementations.

In the embodiment illustrated in FIG. 3, the programmable value 332-1 (ResetStage1<10:0>) is provided to count compare circuit 338-1 and the programmable value 333-1 (tmfzResetCur1<4:0>) is provided to the pulse shaping circuit 350. The value of the programmable value 333-1 corresponds to the particular value to be generated by pulse shaping circuit 350 and applied to reset current control bus 354, e.g., the particular value of ResetCur<4:0>. As such, the value of the programmable value 333-1 indicates a particular current magnitude to be output by write driver 355. The value of the programmable value 332-1 indicates a particular time duration that the particular current magnitude indicated by the value of programmable value 333-1 is to be output by write driver 355. That is, the programmed value 332-1 indicates how long the programmed value 333-1 is to be carried by current control bus 354 during a reset programming operation. The programmable value 332-2 (ResetStage2<10:0>) is provided to count compare circuit 338-2 and the programmable value 333-2 (tmfzResetCur2<4:0>) is provided to the pulse shaping circuit 350. The value of the programmable value 333-2 corresponds to the particular value to be generated by pulse shaping circuit 350 and applied to reset current control bus 354. As such, the value of the programmable value 333-2 indicates a particular current magnitude to be output by write driver 355. The value of the programmable value 332-2 indicates a particular time duration that the particular current magnitude indicated by the value of programmable value 333-2 is to be output by write driver 355. That is, the programmed value 332-2 indicates how long the programmed value 333-2 is to be carried by current control bus 354 during a reset programming operation.

Although not illustrated in the embodiment illustrated in FIG. 3, the programming circuitry shown in FIG. 3 can include components configured to increase or decrease the magnitude of a reset current signal in a ramped manner, e.g., as a number of stepped increments or decrements. Also, in one or more embodiments, separate counters can be used for set and reset operations. For example, the counter 322 can be used for set operations, and a separate counter (not shown in FIG. 3) can be used for reset operations. That is, embodiments of the present disclosure are not limited to the particular programming circuitry embodiment illustrated in the example of FIG. 3.

FIG. 4 illustrates an example of a programming signal 440 in accordance with an embodiment of the present disclosure. In the embodiment illustrated in FIG. 4, the programming signal is a set programming signal 440. That is, the programming signal 440 is applied to one or more phase change memory cells in order to place the cells in a set state, e.g., a relatively low resistivity state. The programming signal 440 can be produced via programming circuitry such as that described above in connection with FIG. 3.

In the embodiment illustrated in FIG. 4, the programming signal 440 can be considered a multiple stage programming signal. In this example, the programming signal 440 is shaped in three stages, e.g., 442-1, 442-2, and 442-3. As described above, the current magnitude and duration of each stage can be based on programmable digital values. In the embodiment illustrated in FIG. 4, the duration of the first stage 442-1 is about 15 ns and has a magnitude of about 1500 μA. The relatively high magnitude and short duration of the first stage 442-1 can be used to charge a bit line capacitance of one or more bit lines to which the signal 440 is applied in a short amount of time. Rapidly charging the bit line capacitance can provide benefits such as reducing the overall time of the set programming operation.

In the embodiment illustrated in FIG. 4, the second stage 442-2 of the current signal 440 has a duration of about 50 ns and a magnitude of about 650 μA. In various embodiments, the magnitude and duration of the second stage 442-2 can be sufficient to melt a phase change memory material, e.g., phase change material 104 illustrated in FIG. 1, of the one or more memory cells being programmed.

In the embodiment illustrated in FIG. 4, the third stage 442-3 of the current signal 440 is a stepped trailing portion of the signal 440 such as described above. In the embodiment illustrated in FIG. 4, the third stage 442-3 is stepped down over a duration of about 325 ns. That is, the magnitude of the trailing portion 442-3 of the applied programming signal 440 is successively decreased according to a number of particular decrements. In the embodiment illustrated in FIG. 4, the trailing portion 442-3 is decreased in a linear manner, e.g., the duration 447 and magnitude decrement 446 associated with each of the number of steps 444 is the same. In this example, the magnitude decrement 446 is about 50 μA and the duration 447 is about 25 ns for each of the steps 444 in trailing portion 342-3.

As described above, the current magnitude level associated with each step 444 is based on a digital value provided to a write driver circuit, e.g., write driver 355 shown in FIG. 3. The digital value provided to the write driver can be changed, e.g., via decrementing counter 337 shown in FIG. 3, resulting in a corresponding magnitude change in the current output signal of the driver.

As described in connection with FIGS. 5A and 5B, the duration 447 of each of the steps 444 can be modified, increased or decreased. Increasing or decreasing the duration 447 can result in a nonlinear stepped down ramp of the trailing portion 442-3. The duration 447 can be digitally modified via an ALU, e.g., ALU 330 shown in FIG. 3, or other logic components.

Applying a set programming signal such as signal 440 to one or more phase change memory cells can be used to alter a resistance of a phase change memory element such that the resistance is within a predetermined range, e.g., within resistance distribution corresponding to a desired data state. Providing a trailing portion, e.g., 442-3, in accordance with embodiments described herein can create relatively narrow resistance distributions associated with programmed data states, which can provide benefits such as improved data retention and reduced read errors, among other benefits.

Embodiments of the present disclosure are not limited to the example illustrated in FIG. 4. For instance, various other shapes of the set programming signal 440 can be produced in accordance with embodiments of the present disclosure. As an example, the number of steps 444 can be more or fewer than illustrated in FIG. 4.

FIG. 5A illustrates a portion 560-1 of a programming signal according to an embodiment of the present disclosure. FIG. 5B illustrates a portion 560-2 of a programming signal according to an embodiment of the present disclosure. In various embodiments, the portions 560-1 and 560-2 can be a stepped trailing portion of a multiple stage programming signal, e.g., set signal 440 described in connection with FIG. 4.

In the embodiments illustrated in FIGS. 5A and 5B, the signal portions 560-1 and 560-2 represent a nonlinear stepped ramp down of the set programming current signal. The signal portions 560-1 and 560-2 can be produced by programming circuitry such as that described in connection with FIG. 3.

In the embodiment illustrated in FIG. 5A, the signal 560-1 is stepped down over a duration of about 350 ns. The magnitude of the signal 560-1 is successively decreased in a nonlinear manner according to a number of particular decrements. That is, in the embodiment illustrated in FIG. 5A, the duration and magnitude decrement associated with the number of steps varies. For instance, in the embodiment illustrated in FIG. 5A, the duration associated with each successive step is the same or larger than the previous step. As an example, consider the successive steps 544-1 and 544-2 illustrated in FIG. 5A. The duration 547-2 of step 544-2 is longer than the duration 547-1 of the previous step 544-1.

In the embodiment illustrated in FIG. 5A, the magnitude decrement 546-1 between successive steps 544-1 and 544-2, as well as the other steps, is the same, e.g., about 50 μA in this example. However, embodiments are not so limited. That is, in one or more embodiments, the magnitude decrement between successive steps, e.g., magnitude decrement 546-1, can be varied.

As described above, the particular current magnitude of a particular step can be based on a digital value carried by a set current control bus, e.g., set current control bus 352 shown in FIG. 3. For example, the current magnitude of step 544-1, e.g., about 250 μA, can correspond to a particular digital value generated by a current shaping component and applied to a current control bus, and the current magnitude of step 544-2, e.g., about 200 μA, can correspond to a different digital value generated by a current shaping component and applied to a current control bus. As described above, the digital value applied to the current control bus can be decremented after each subsequent step in order to change the current output signal of the write driver in a step down manner such as that shown in the embodiment illustrated in FIG. 5A.

In the embodiment illustrated in FIG. 5B, the signal 560-2 is stepped down over a duration of about 300 ns. The magnitude of the signal 560-2 is successively decreased in a nonlinear manner according to a number of particular decrements. That is, in the embodiment illustrated in FIG. 5B, the duration and magnitude decrement associated with the number of steps varies. For instance, in the embodiment illustrated in FIG. 5B, the duration associated with each successive step is the same or smaller than the previous step. As an example, consider the successive steps 544-3 and 544-4 illustrated in FIG. 5B. The duration 547-4 of step 544-4 is shorter than the duration 547-3 of the previous step 544-3.

In the embodiment illustrated in FIG. 5B, the magnitude decrement 546-3 between successive steps 544-3 and 544-4, as well as the other steps, is the same, e.g., about 50 µA in this example. However, embodiments are not so limited. That is, in one or more embodiments, the magnitude decrement between successive steps, e.g., magnitude decrement 546-3, can be varied.

As described above, the current magnitude level associated with each step, e.g., 544-3 and 544-4, is based on a digital value provided to a write driver circuit, e.g., write driver 355 shown in FIG. 3. The digital value provided to the write driver can be changed, e.g., via decrementing counter 337 shown in FIG. 3, resulting in a corresponding magnitude change in the current output signal of the driver.

Figure 6:
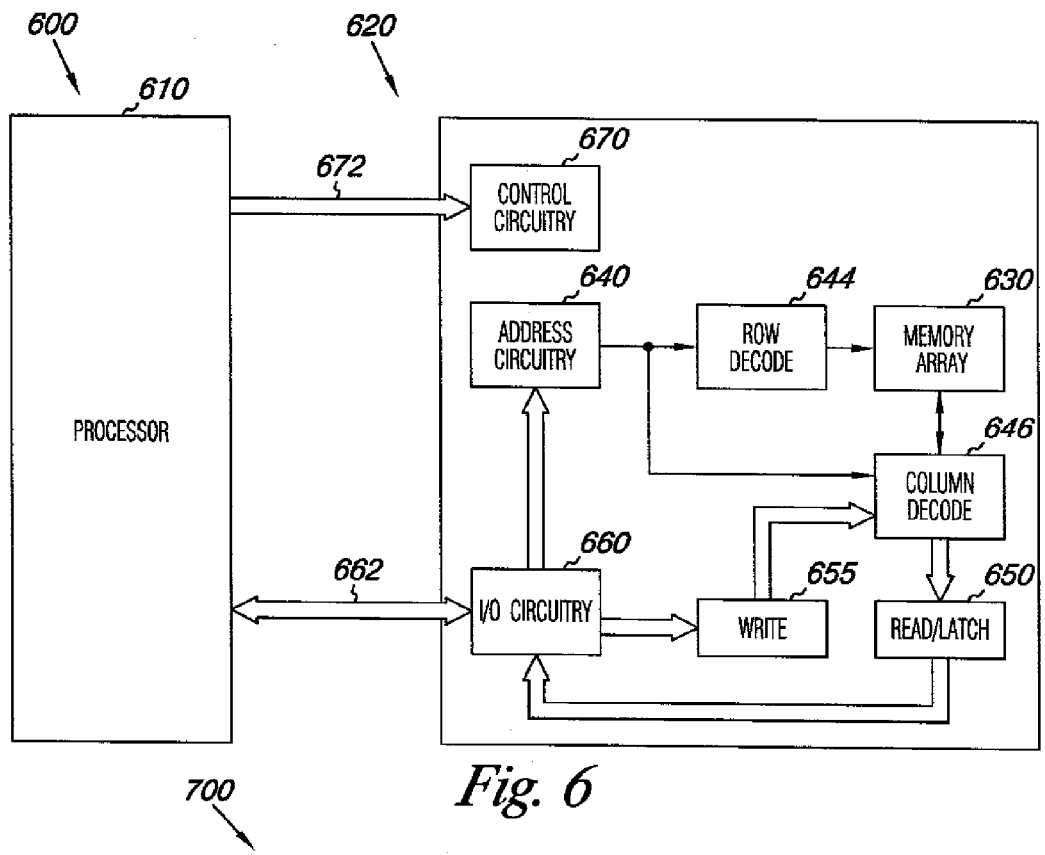
FIG. 6 is a functional block diagram of an electronic memory system having at least one memory device in accordance with an embodiment of the present disclosure.

FIG. 6 is a functional block diagram of an electronic memory system 600 having at least one memory device in accordance with an embodiment of the present disclosure. Memory system 600 includes a processor 610 coupled to a non-volatile memory device 620 that includes a memory array 630 of phase change memory cells, e.g., phase change array 100 described in connection with FIG. 1. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

For clarity, the electronic memory system 600 has been simplified to focus on features with particular relevance to the present disclosure. The memory device 620 includes an array of phase change memory cells 430, which can be organized according to various architectures known in the art. The access devices of each row of memory cells are coupled with a word line, while phase change memory elements of the memory cells are coupled to bit lines.

The embodiment of FIG. 6 includes address circuitry 640 to latch address signals provided over I/O connections 662 through I/O circuitry 660. Address signals are received and decoded by a row decoder 644 and a column decoder 646 to access the memory array 630.

The memory array 630 can include phase change memory cells programmed according to embodiments described herein. The memory device 620 reads data in the memory array 630 by sensing voltage and/or current changes in the memory array columns using sense/buffer circuitry that in this embodiment can be read/latch circuitry 650. The read/latch circuitry 650 can be coupled to read and latch data from the memory array 630. I/O circuitry 660 is included for bi-directional data communication over the I/O connections 662 with the processor 610.

Write circuitry 655 is included to write data to the memory array 630. The write circuitry 655 can include programming circuitry such as that described in connection with FIG. 3.

Control circuitry 670 decodes signals provided by control connections 672 from the processor 610. These signals can include chip signals, write enable signals, and address latch signals that are used to control the operations on the memory array 630, including data read, data write, and data erase operations. In various embodiments, the control circuitry 670 is responsible for executing instructions from the processor 610 to perform the operating and programming embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
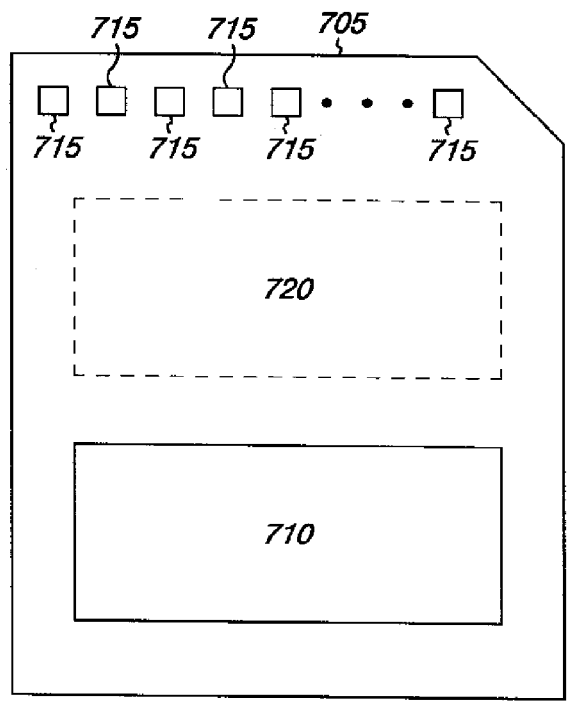
FIG. 7 is a functional block diagram of a memory module having at least one memory device in accordance with an embodiment of the present disclosure.

FIG. 7 is a functional block diagram of a memory module 700 having at least one memory device in accordance with an embodiment of the present disclosure. Memory module 700 is illustrated as a memory card, although the concepts discussed with reference to memory module 700 are applicable to other types of removable or portable memory (e.g., USB PCRAM drives) and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 includes an array of phase change memory cells programmed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB PCRAM drive, the contacts 715 might be in the form of a USB Type-A male connector. For some embodiments, the contacts 715 may be in the form of a semi-proprietary interface. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a resistance variable memory device, comprising:
    applying a programming signal to a resistance variable material of a memory cell; and
    decreasing a magnitude of at least a trailing portion of the applied programming signal successively according to a number of particular decrements, a magnitude and a duration of the number of particular decrements corresponding to particular programmed values.

2. The method of claim 1, wherein the programming signal is a current pulse and the method includes applying the current pulse to the resistance variable material from a driver circuit, the current magnitude output by the driver circuit changes in response to a change to a digital value received by the driver circuit.

3. The method of claim 1, including decreasing the magnitude of the trailing portion of the applied programming signal in a stepped manner, wherein the number of particular decrements each have an associated magnitude corresponding to a particular digital value.

4. The method of claim 1, including modifying the duration of the number of particular decrements.

5. The method of claim 4, including decreasing the duration of the number of particular decrements.

6. The method of claim 4, including increasing the duration of the number of particular decrements.

7. The method of claim 1, including applying the programming signal in multiple stages, a current magnitude and a duration of each stage based on a programmable digital value.

8. The method of claim 7, wherein the at least a trailing portion of the applied programming signal occurs during a stage subsequent to at least a first and a second stage.

9. The method of claim 8, wherein a duration of the first stage of the programming signal is shorter than a duration of the second stage of the programming signal.

10. The method of claim 9, wherein the at least a trailing portion corresponds to a third stage of the programming signal and a duration of the third stage is longer than the duration of the first stage and the duration of the second stage.

11. A method for operating a resistance variable memory device, comprising:
    applying a programming current waveform to a resistance variable material of a memory cell; and
    adjusting at least a trailing portion of the applied programming current waveform such that a number of different particular current magnitudes are applied to the resistance variable material;
    wherein each of the number of different particular current magnitudes is applied to the resistance variable material for a particular duration, and wherein the different particular current magnitudes are based on different digital values provided to a driver circuit.

12. The method of claim 11, wherein adjusting includes decreasing the different particular current magnitudes applied to the resistance variable material.

13. The method of claim 11, including adjusting the particular duration that the number of different particular current magnitudes are applied by using an arithmetic logic unit.

14. The method of claim 11, including applying the programming current waveform to the resistance variable material such that a resistance of the resistance variable material is within a predetermined range.

15. A resistance variable memory device, comprising:
    an array of resistance variable memory cells; and
    programming circuitry coupled to the array, the circuitry including:
        a driver circuit configured to apply a programming signal to a sense line of the array to program a resistance variable memory cell to a particular state; and
        a waveform shaping component having an output bus coupled to the driver circuit, a magnitude of the applied programming signal determined by a value applied to the output bus; and
        wherein the waveform shaping component is configured to modify a magnitude of at least a trailing portion of the programming signal by applying a number of particular values to the output bus to decrease the magnitude of the trailing portion according to a number of programmed values provided to the waveform shaping component.

16. The device of claim 15, wherein the magnitude of the trailing portion is decreased in a number of successive steps, a magnitude of each step corresponding to one of the number of programmed values provided to the waveform shaping circuit.

17. The device of claim 16, wherein a duration of each of the number of successive steps corresponds to one of the number of programmed values provided to the waveform shaping circuit.

18. The device of claim 16, wherein the programming circuitry includes a programmable fuse array programmed to provide the number of programmed values to the waveform shaping component.

19. The device of claim 16, wherein a duration of the number of successive steps provides a linear ramp down of the at least a trailing portion.

20. The device of claim 16, wherein a duration of the number of successive steps is adjusted to provide a nonlinear ramp down of the at least a trailing portion.

21. A memory device comprising:

an array of resistance variable memory cells; and programming circuitry coupled to the array and configured to program a number of resistance variable memory cells to particular states corresponding to particular resistance values, the programming circuitry including:

a driver circuit configured to apply a programming current waveform to a sense line coupled to the number of resistance variable memory cells; and a waveform shaping component configured to:

generate a digital value on an output bus coupled to the driver circuit, wherein the generated digital value corresponds to a magnitude of the applied programming current waveform; and change the generated digital value in response to one or more received digital input values such that a magnitude of at least a trailing portion of the programming current waveform is decreased in a number of stepped down decrements.

22. The device of claim 21, wherein the programming current waveform is a multiple stage set current signal.

23. The device of claim 22, wherein:

a duration of a first stage of the set current signal is shorter than a duration of a second stage of the set current signal;

the trailing portion corresponds to a third stage of the set current signal; and a duration of the third stage is longer than the duration of the first stage and the duration of the second stage.

* * * * *